United States Patent
Lee et al.

(10) Patent No.: US 10,043,772 B2
(45) Date of Patent: Aug. 7, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Sang Kyu Lee, Suwon-si (KR); Jin Gu Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/489,117

(22) Filed: Apr. 17, 2017

(65) Prior Publication Data

US 2017/0373030 A1    Dec. 28, 2017

(30) Foreign Application Priority Data

Jun. 23, 2016 (KR) .................. 10-2016-0078610
Jul. 25, 2016 (KR) .................. 10-2016-0094309

(51) Int. Cl.
*H01L 23/00* (2006.01)
*H01L 23/31* (2006.01)

(52) U.S. Cl.
CPC .......... *H01L 24/06* (2013.01); *H01L 23/3128* (2013.01); *H01L 24/05* (2013.01);
(Continued)

(58) Field of Classification Search
CPC ....... H01L 23/498; H01L 23/29; H01L 23/31; H01L 21/56; H01L 23/00; H01L 23/367; H01L 21/48; H01L 23/552; H01L 23/538; H01L 2/49827; H01L 23/3128; H01L 23/49816; H01L 23/49838; H01L 23/5389;
(Continued)

(56) References Cited

U.S. PATENT DOCUMENTS 7,977,789 B2  7/2011 Park
8,692,363 B2  4/2014 Koizumi et al.
(Continued)

OTHER PUBLICATIONS

Taiwanese Office Action issued in corresponding Taiwanese Patent Application No. 106112104, dated Mar. 14, 2018. (with English translation).

*Primary Examiner* — Alexander Oscar Williams
(74) *Attorney, Agent, or Firm* — McDermott Will & Emery LLP

(57) ABSTRACT

A fan-out semiconductor package includes: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the semiconductor chip; a second interconnection member disposed on the first interconnection member and the semiconductor chip; and connection terminals disposed on the second interconnection member. The first interconnection member and the second interconnection member respectively include redistribution layers electrically connected to the connection pads of the semiconductor chip, and a connection pad and a connection terminal are electrically connected to each other by a pathway passing through the redistribution layer of the first interconnection member.

21 Claims, 12 Drawing Sheets

(52) U.S. Cl.
CPC ...... *H01L 24/13* (2013.01); *H01L 2224/0235* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/0401* (2013.01); *H01L 2224/04105* (2013.01); *H01L 2224/05569* (2013.01); *H01L 2224/06182* (2013.01); *H01L 2224/13024* (2013.01)

(58) Field of Classification Search
CPC . H01L 34/49811; H01L 24/02; H01L 21/486; H01L 21/4846; H01L 2224/02379; H01L 2224/023733; H01L 24/06; H01L 24/05; H01L 24/13; H01L 2224/04105; H01L 2224/0401; H01L 2224/02381; H01L 2224/02375; H01L 2224/02373; H01L 2224/0235; H01L 2224/02331; H01L 2224/05569; H01L 2224/06182; H01L 2224/13024

USPC ........ 257/738, 737, 734, 778, 668, 774, 773
See application file for complete search history.

(56) References Cited

U.S. PATENT DOCUMENTS

| | | | |
|---|---|---|---|
| 8,941,230 B2 | 1/2015 | Kyozuka et al. | |
| 2010/0144152 A1* | 6/2010 | Park | H01L 21/4832 438/694 |
| 2013/0256884 A1 | 10/2013 | Meyer | |
| 2015/0115465 A1 | 4/2015 | Lin et al. | |
| 2015/0364394 A1 | 12/2015 | Lin | |
| 2016/0118333 A1 | 4/2016 | Lin | |
| 2017/0201650 A1* | 7/2017 | Mikami | H04N 1/4426 |
| 2017/0263522 A1* | 9/2017 | Kim | H01L 23/3171 |
| 2017/0287825 A1* | 10/2017 | Lee | H01L 23/49827 |
| 2017/0287839 A1* | 10/2017 | Lee | H01L 23/5389 |
| 2017/0287872 A1* | 10/2017 | Shen | H01L 25/0655 |
| 2017/0294409 A1* | 10/2017 | Yu | H01L 25/0655 |
| 2017/0294422 A1* | 10/2017 | Solimando | H01L 25/105 |

* cited by examiner

I-I'

II-II'

| | Temperature CyCling(-40 ~ 125°C)by Via Type | | |
|---|---|---|---|
| | Comparative Example 1 | Comparative Example 2 | Inventive Example |
| 1 | 442 | 1,020 | 2,013 |
| 2 | 594 | 1,320 | 2,802 |
| 3 | 513 | 990 | 3,611 |
| 4 | 829 | 921 | 2,441 |
| 5 | 882 | 789 | 2,981 |
| 6 | 782 | 1,421 | 3,440 |
| 7 | 821 | 1,002 | 2,612 |
| 8 | 561 | 1,120 | 2,312 |
| 9 | 890 | 990 | 2,800 |
| 10 | 553 | 1,020 | 2,981 |

FAN-OUT SEMICONDUCTOR PACKAGE

CROSS-REFERENCE TO RELATED APPLICATION(S)

This application claims the benefit of priority to Korean Patent Application Nos. 10-2016-0078610 filed on Jun. 23, 2016 and 10-2016-0094309 filed on Jul. 25, 2016 in the Korean Intellectual Property Office, the entire disclosure of which is incorporated herein by reference.

BACKGROUND

1. Technical Field

The present disclosure relates to a semiconductor package, and more particularly, to a fan-out semiconductor package in which connection terminals may extend outwardly of a region in which a semiconductor chip is disposed.

2. Description of Related Art

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package having excellent performance and where board level reliability may be improved.

According to an aspect of the present disclosure, a fan-out semiconductor package may be provided, in which a connection pad of a semiconductor chip is connected to a connection terminal through a meandering electrical pathway to allow stress transferred from the connection terminal to be offset in a process in which the stress passes through the meandering electrical pathway.

According to an aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the semiconductor chip; a second interconnection member disposed on the first interconnection member and the semiconductor chip; and connection terminals disposed on the second interconnection member, wherein the first interconnection member and the second interconnection member respectively include redistribution layers electrically connected to the connection pads of the semiconductor chip, and a connection pad and a connection terminal are electrically connected to each other by an electrical pathway passing through the redistribution layer of the first interconnection member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
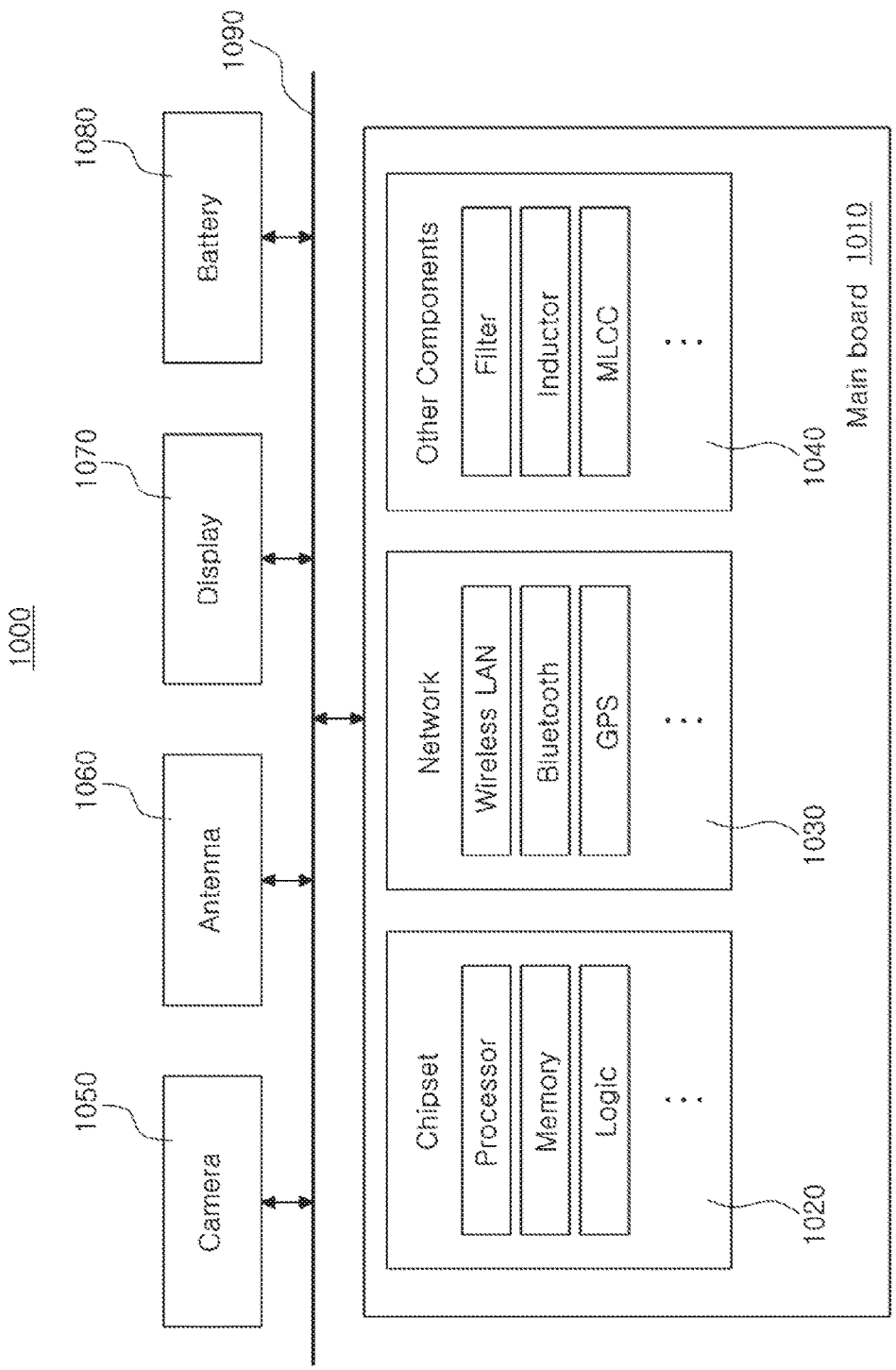
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are as depicted in the attached drawings. For example, a first interconnection member is disposed on a level above a redistribution layer. In addition, in the present disclosure, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings. However, the claims are not limited thereto.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
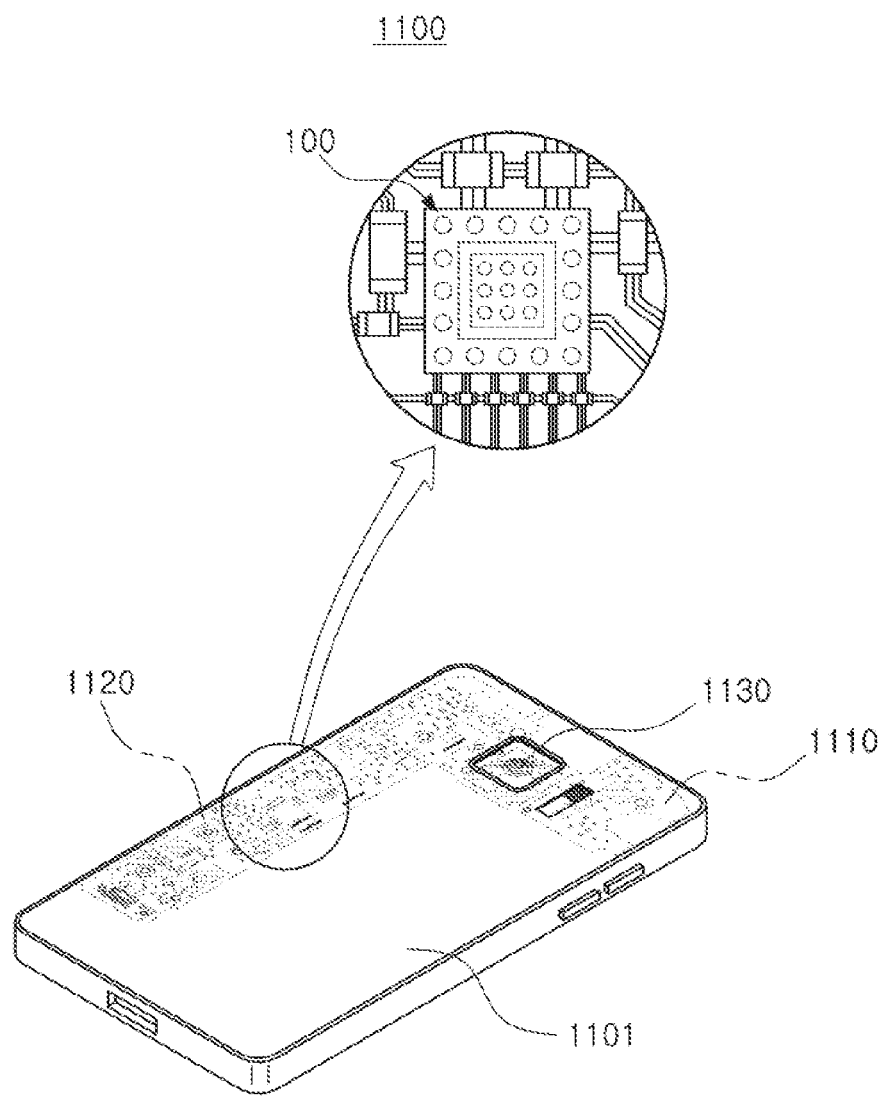
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
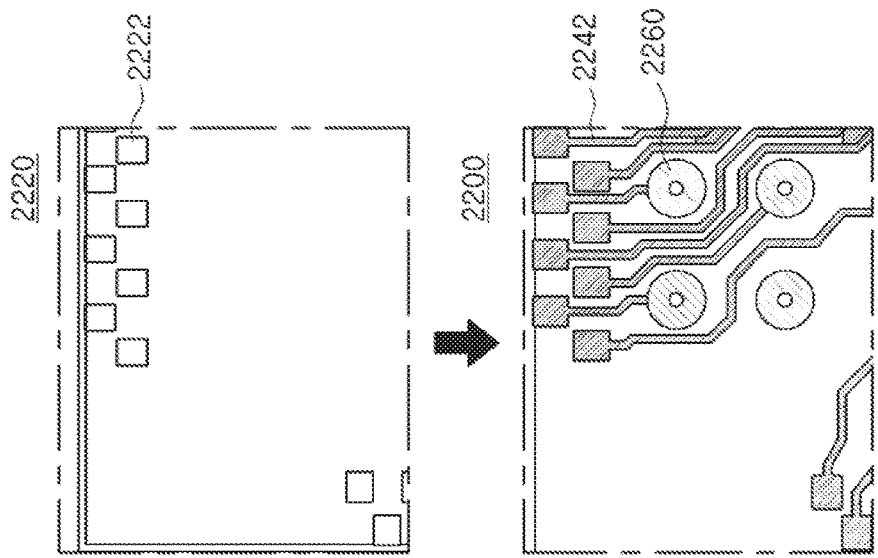
FIGS. 3A and 3B are schematic cross-sectional views illustrating states of a fan-in semiconductor package before and after being packaged.
Figure 3A:
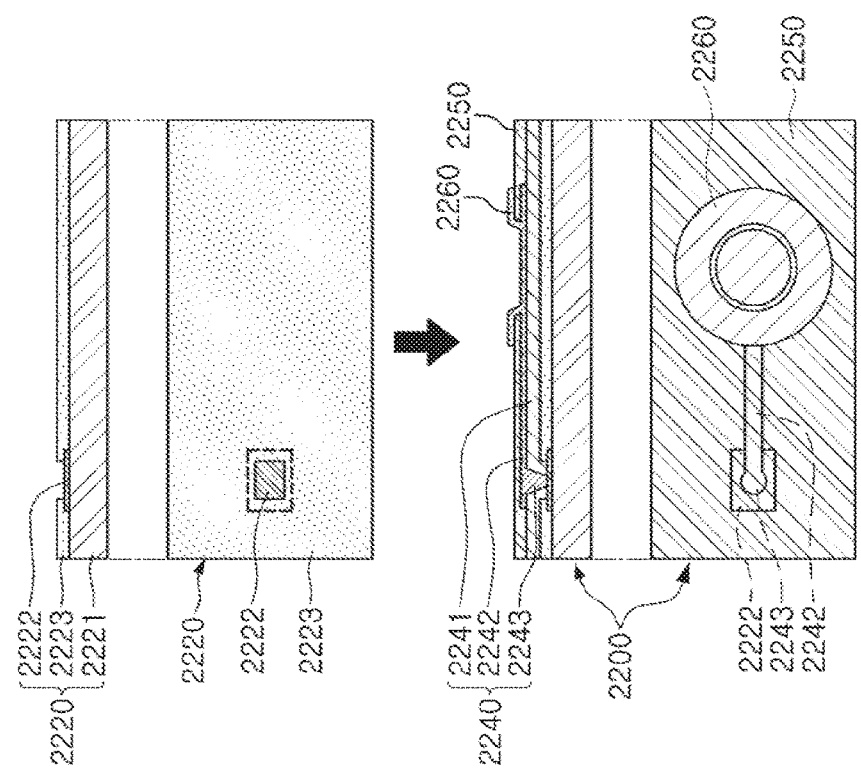

FIGS. 3A and 3B are schematic cross-sectional views illustrating states of a fan-in semiconductor package before and after being packaged.

Figure 4:
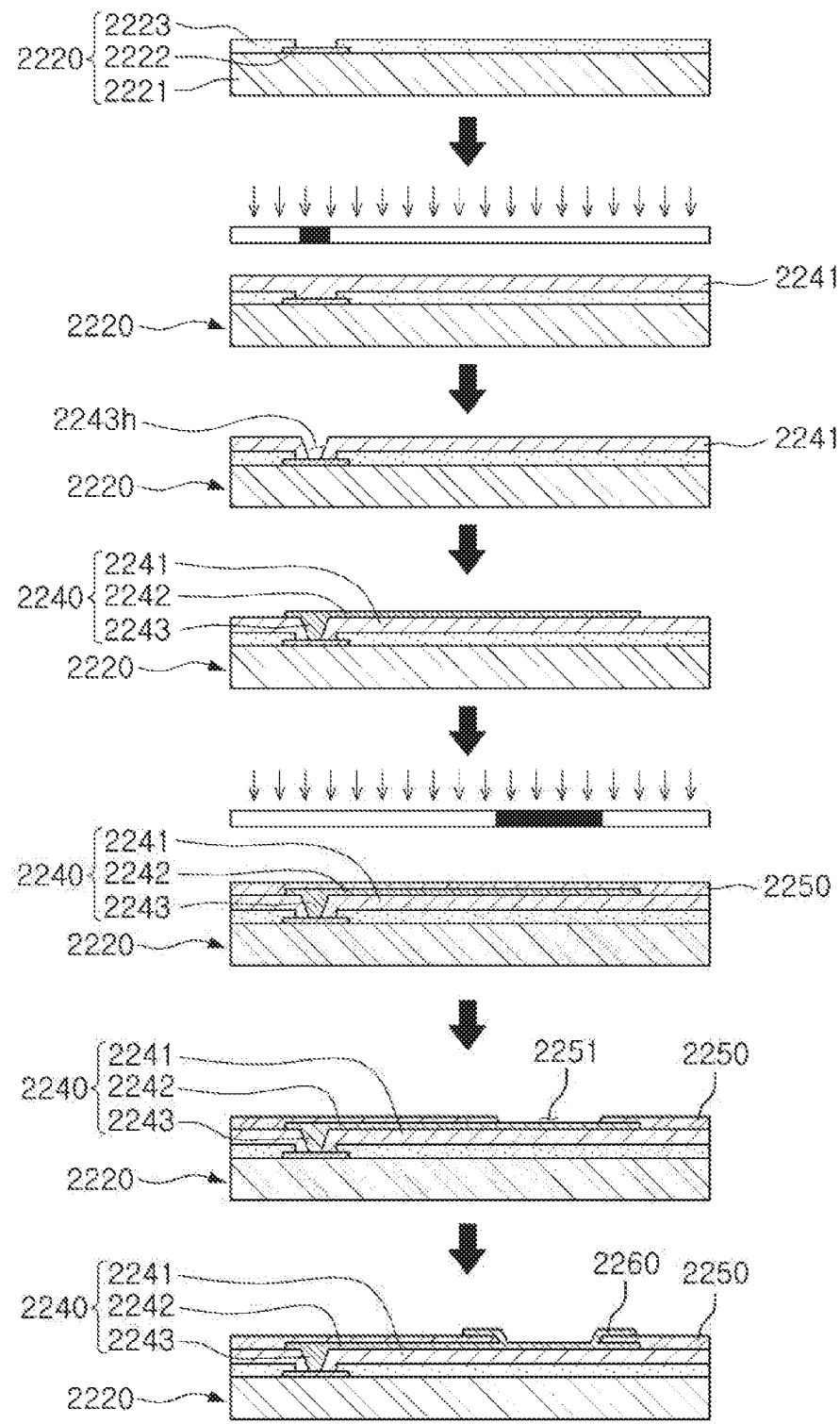
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
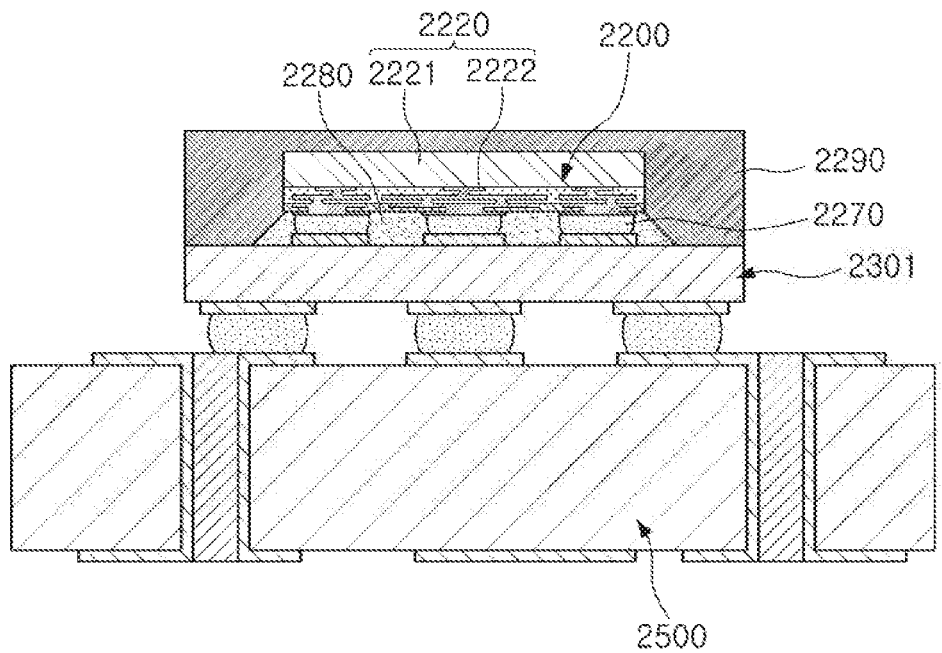
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
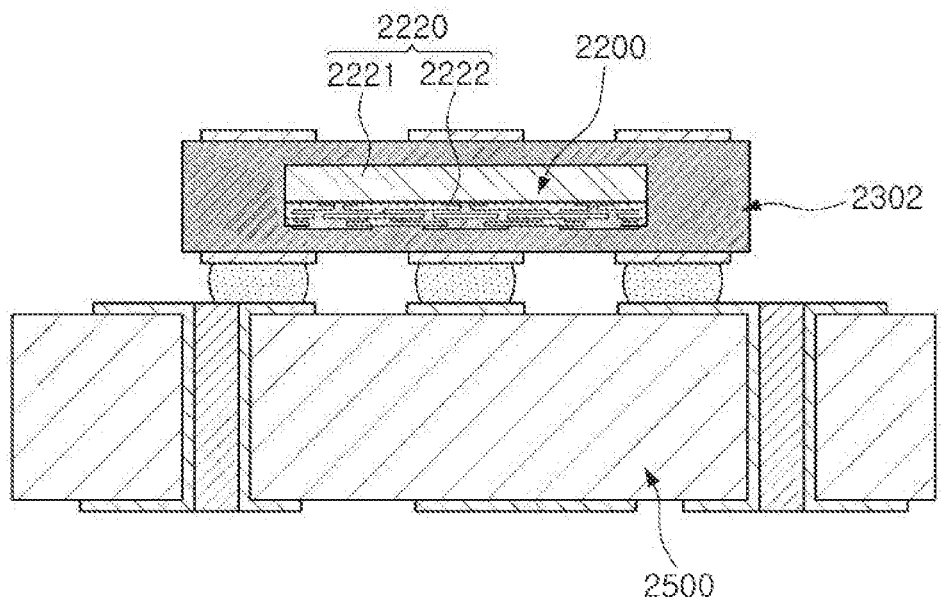
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
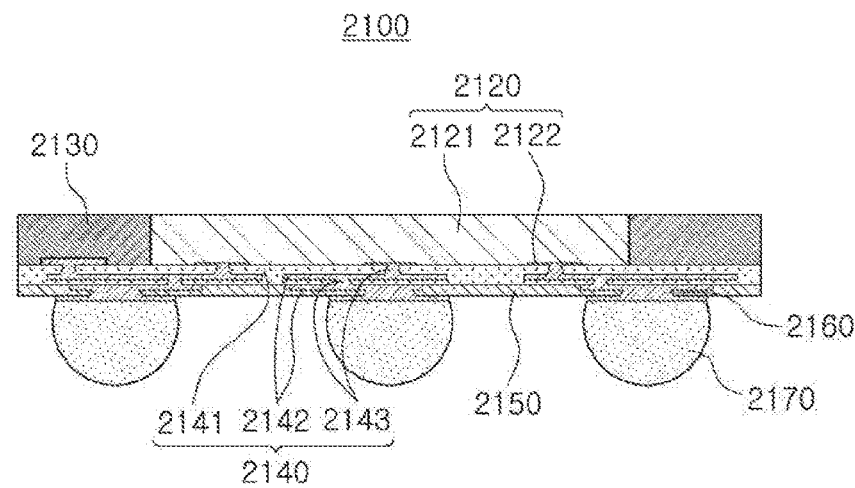
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as is, such that the fan-out semiconductor package may be mounted on the main board of the electronic device without using a separate interposer substrate, as described below.

Figure 8:
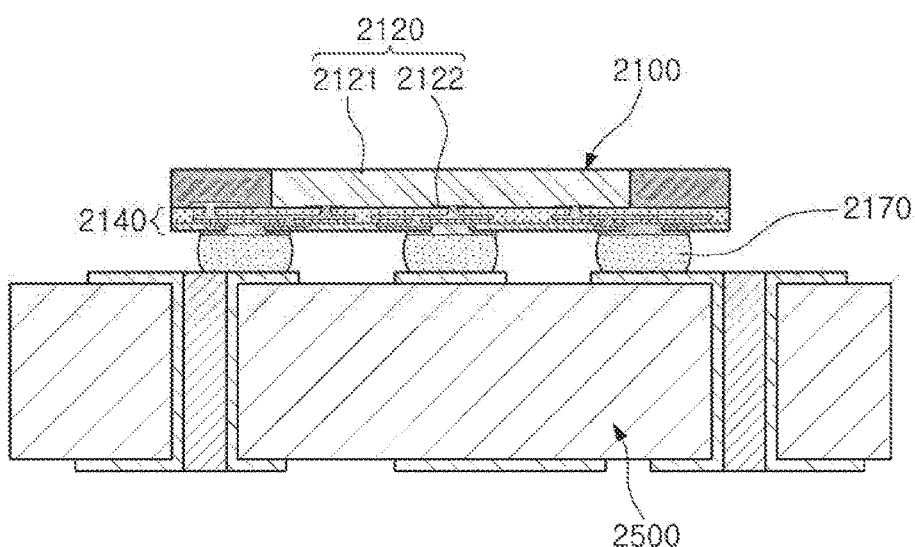
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package having excellent performance and improved board level reliability will hereinafter be described with reference to the drawings.

Figure 9:
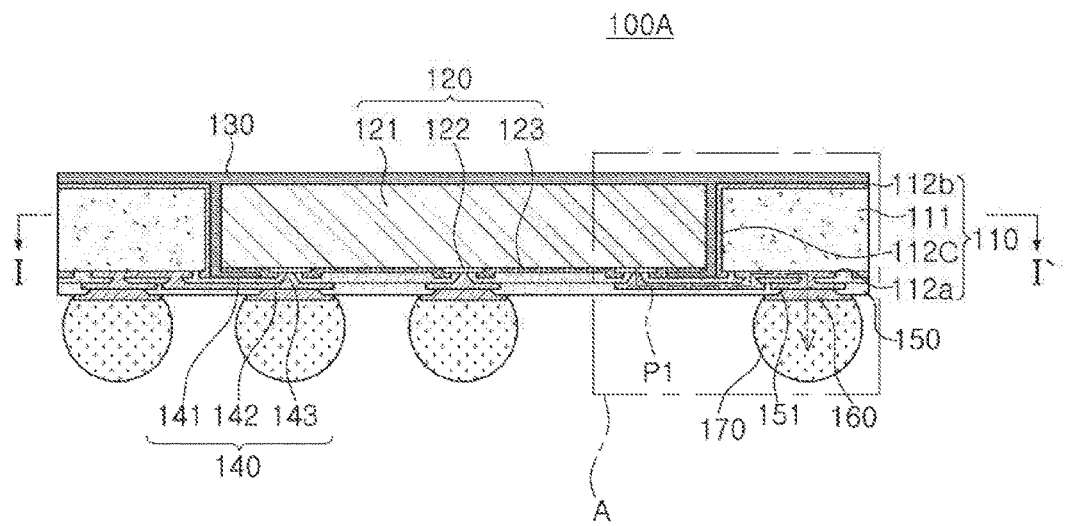
FIG. 9 is a schematic cross-sectional view illustrating an example of a fan-out semiconductor package.

FIG. 9 is a schematic cross-sectional view illustrating an example of a fan-out semiconductor package.

Figure 10:
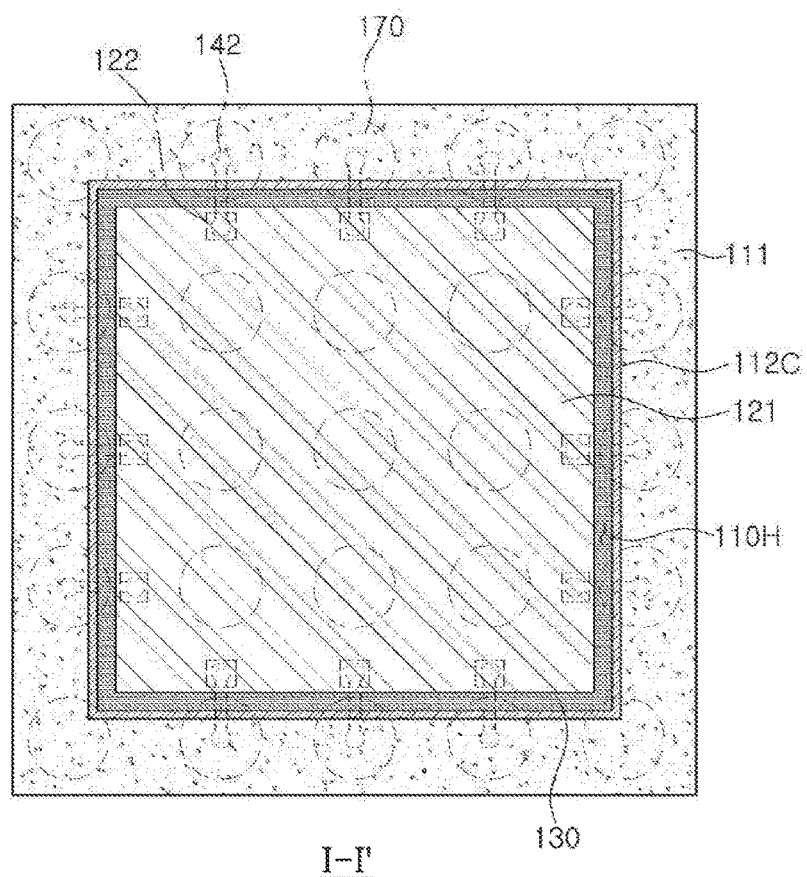
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11:
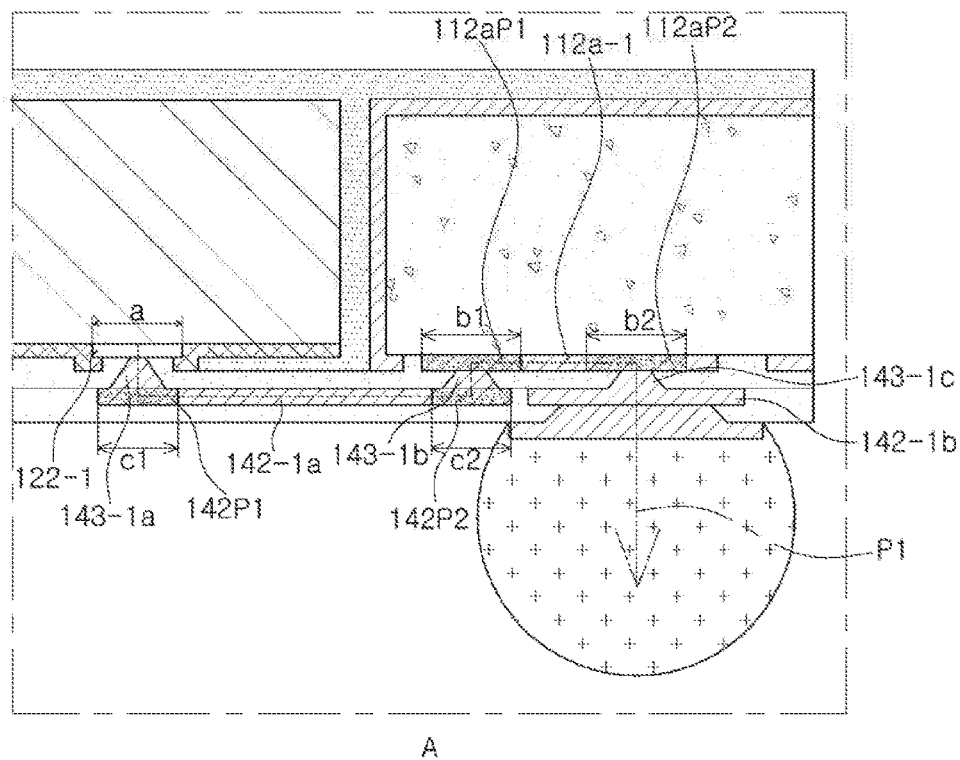
FIG. 11 is a schematic enlarged view illustrating region A of the fan-out semiconductor package of FIG. 9.

FIG. 11 is a schematic enlarged view illustrating region A of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H and having connection pads 122 disposed on one surface thereof, an encapsulant 130 encapsulating at least portions of the first interconnection member 110 and the semiconductor chip 120, a second interconnection member 140 disposed on the first interconnection member 110 and the semiconductor chip 120 and redistributing the connection pads 122 up to a fan-out region, a passivation layer 150 disposed on the second interconnection member 140 and having openings 151 exposing at least portions of connection terminal pads of the second interconnection member 140, an under-bump metal layer 160 disposed in the openings 151 of the passivation layer 150, and connection terminals 170 disposed on the under-bump metal layer 160.

In this case, at least one connection pad 122-1 of the connection pads 122 of the semiconductor chip 120, for example, a connection pad 122-1 disposed in an outer region of the fan-out semiconductor package on which stress is concentrated, may be electrically connected to at least one 170-1 of the connection terminals 170 through an electrical pathway P1 passing through a via 143-1a of the second interconnection member 140, a redistribution layer 142-1a of the second interconnection member 140, a via 143-1b of the second interconnection member 140, a redistribution layer 112a-1 of the first interconnection member 110, a via 143-1c of the second interconnection member 140, and a redistribution layer 142-1b of the second interconnection member 140 in the abovementioned sequence or in the opposite sequence.

Generally, in a case in which a fan-out semiconductor package is mounted directly on a main board, or the like, of an electronic device, stress depending on thermal expansion or contraction, or the like, of the main board may be transferred into the fan-out semiconductor package through connection terminals. When this stress is not dispersed, a fracture may be generated in connection pads of the semiconductor chip. Therefore, an open defect of vias of a redistribution layer connected to the connection pads may be generated. The stress may be more severely applied particularly to an outer region of the fan-out semiconductor package, specifically, the outer region of the fan-out semiconductor package surrounding a central region of the fan-out semiconductor package as compared to the central region in relation to a through-hole in which the semiconductor chip is disposed.

On the other hand, in a case in which at least one 122-1 of the connection pads 122 of the semiconductor chip 120, for example, the connection pad 122-1 disposed in the outer region of the fan-out semiconductor package on which stress is concentrated, is electrically connected to at least one 170-1 of the connection terminals 170 through the electrical pathway P1 passing through the redistribution layer 112a-1 disposed on one side of the first interconnection member 110 as described above as in the fan-out semiconductor package 100A according to the exemplary embodiment, a vertical cross-sectional shape of the electrical pathway P1 may be a meandering shape and a direction of the electrical pathway P1 may be alternately changed into one direction and the other direction, such that the stress transferred from the connection terminals after the fan-out semiconductor package 100A is mounted on a board may be offset in a process in which the stress passes through the electrical pathway P1. Resultantly, board level reliability of the fan-out semiconductor package 100A may be improved.

Meanwhile, horizontal cross-sectional areas b1 and b2 of some via pads 112aP1 and 112aP2 of the redistribution layer 112a-1 formed on one side of the first interconnection member 110 may be equal to or greater than a horizontal cross-sectional area a of the connection pad 122-1. For example, a ratio (b1 or b2/a) between the horizontal cross-sectional areas may be about 1 to 2. More preferably, the ratio (b1 or b2/a) may exceed 1 and may be 2 or less. In addition, the horizontal cross-sectional areas b1 and b2 of some via pads 112aP1 and 112aP2 of the redistribution layer 112a-1 formed on one side of the first interconnection member 110 may be equal to or greater than horizontal cross-sectional areas c1 and c2 of some via pads 142P1 and 142P2 of the redistribution layer 142-1a of the second interconnection member 140. For example, a ratio (b1 or b2/c1 or c2) between the horizontal cross-sectional areas may be about 1 to 2. More preferably, the ratio (b1 or b2/c1 or c2) may exceed 1 and may be 2 or less. In addition, the horizontal cross-sectional area a of the connection pad 122-1 may be equal to or greater than the horizontal cross-sectional areas c1 and c2 of some via pads 142P1 and 142P2 of the redistribution layer 142-1a of the second interconnection member 140. For example, a ratio (a/c1 or c2) between the horizontal cross-sectional areas may be about 1 to 2. More preferably, the ratio (a/c1 or c2) may exceed 1 and may be 2 or less. In a case in which the size relationships described above are satisfied, matching properties of the vias 143-1a and 143-1b of the second interconnection member 140 in a process may be improved.

In detail, the fan-out semiconductor package 100A according to the exemplary embodiment may be manufactured by forming the first interconnection member 110, disposing the semiconductor chip 120 in the first interconnection member 110, encapsulating the first interconnection member 110 and the semiconductor chip 120 with the encapsulant 130, and forming the second interconnection member 140 on one surfaces of the first interconnection member 110 and the semiconductor chip 120. In this case, due to a tolerance generated at the time of disposing the semiconductor chip 120, a tolerance caused by contraction, or the like, of the encapsulant 130, and the like, connectivity between the vias 143-1a and 143-1b of the second interconnection member 140 and the connection pad 122-1 of the semiconductor chip 120 or the via pads 112aP1 and 112aP of the first interconnection member 110 at the time of connecting the vias 143-1a and 143-1b to the connection pad 122-1 or the via pads 112aP1 and 112aP2 may be reduced. The horizontal cross-sectional area a of the connection pad 122-1 of the semiconductor chip 120 or the horizontal cross-sectional areas b1 and b2 of the via pads 112aP1 and 112aP2 of the first interconnection member 110 need to be widened in order to significantly reduce tolerances thereof. However, there is a limitation in increasing a two-dimensional area of the connection pad 122-1 of the semiconductor chip 120. Therefore, tolerances generated due to various causes may be significantly reduced by allowing the via pads 112aP1 and 112aP2 of the first interconnection member 110 to have the relatively largest horizontal cross-sectional areas b1 and b2.

Similarly, in the fan-out semiconductor package 100A according to the exemplary embodiment, an exposed horizontal cross-sectional area (not denoted by a reference numeral) of the connection pad 122-1 may be equal to or greater than a connection area (not denoted by a reference numeral) of the via 143-1a of the second interconnection member 140 in contact with the connection pad 122-1. In addition, the horizontal cross-sectional areas b1 and b2 of some via pads 112aP1 and 112aP2 of the redistribution layer 112a-1 formed on one side of the first interconnection member 110 may be equal to or greater than a connection area (not denoted by a reference numeral) of the via 143-1b of the second interconnection member 140 connected to the via pads 112aP1 and 112aP2. In this case, similarly, matching properties of the vias 143-1a and 143-1b of the second interconnection member 140 in a process may be improved.

The respective components included in the fan-out semiconductor package 100A according to the exemplary embodiment will hereinafter be described in more detail.

The first interconnection member 110 may serve to maintain rigidity of the fan-out semiconductor package 100A and secure uniformity of a thickness of the encapsulant 130. In addition, the first interconnection member 110 may include redistribution layers 112a and 112b redistributing the connection pads 122 of the semiconductor chip 120 to thus reduce the number of layers of the second interconnection member 140. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified to have other forms.

The first interconnection member 110 may include an insulating layer 111. In addition, the first interconnection member 110 may include the redistribution layers 112a and 112b disposed, respectively, on one surface and the other surface of the insulating layer 111. The first interconnection member 110 may include a metal layer 112C disposed on a wall of the through-hole 110H, if necessary. A case in which the first interconnection member 110 includes one insulating layer 111 is illustrated in the drawings, but the number of insulating layers may also be more than two.

A material of the insulating layer 111 is not particularly limited. For example, an insulating material may be used as a material of the insulating layer. In this case, the insulating material may be a thermosetting resin such as an epoxy resin, a thermoplastic resin such as a polyimide resin, a resin having a reinforcing material such as a glass cloth or an inorganic filler impregnated in the thermosetting resin and the thermoplastic resin, for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions, depending on designs of layers corresponding thereto. For example, the redistribution layers 112a and 112b may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may serve as a via pad, a connection terminal pad, and the like.

The metal layer 112C may serve to block heat or electromagnetic waves generated from the semiconductor chip 120. The metal layer 112C may be disposed on the wall of the through-hole 110H to surround the semiconductor chip 120. Therefore, the heat generated from the semiconductor chip 120 may be effectively transferred laterally and be then dissipated upwardly and downwardly. In addition, the electromagnetic waves may be effectively blocked. A material of the metal layer 112C may be a conductive material such as copper (Cu), aluminum (Al), silver (Ag), tin (Sn), gold (Au), nickel (Ni), lead (Pb), titanium (Ti), or alloys thereof. In some case, the metal layer 112C may be connected to the redistribution layers 112a and 112b to thus be used as a ground (GND) pattern, or the like.

The semiconductor chip 120 may be an integrated circuit (IC) provided in an amount of several hundreds to several millions of elements or more integrated in a single chip. The IC may be a known semiconductor chip, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 may include a body 121, the connection pads 122 formed on one surface of the body 121, and a passivation layer 123 formed on the body 121 and covering portions of the connection pads 122. The body 121 may be formed on the basis of, for example, an active wafer. In this case, a basic material of the body 121 may be silicon (Si), germanium (Ge), gallium arsenide (GaAs), or the like. The connection pads 122 may electrically connect the semiconductor chip 120 to other components, and a material of each of the connection pads 122 may be a conductive material such as aluminum (Al), or the like. The connection pads 122 may be redistributed by the second interconnection member 140, the first interconnection member 110, and the like. A surface of the semiconductor chip 120 on which the connection pads 122 are disposed may be the active surface, and a surface of the semiconductor chip 120 opposing the active surface may be the inactive surface. The passivation layer 123 may serve to protect the body 121 from external impacts, and may be, for example, an oxide film formed of SiO, etc., a nitride film formed of SiN, etc., or the like, or be a double layer including an oxide layer and a nitride layer. In addition, an insulating layer (not illustrated), or the like, formed of SiO, etc., may be further disposed between the body 121 and the connection pads 122 or between the body 121 and the passivation layer 123.

The encapsulant 130 may be additionally configured to protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover upper surfaces of the first interconnection member 110 and the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on certain materials.

Openings (not illustrated) opening at least portions of the redistribution layer 112b formed on the other side of the first interconnection member 110 may be formed in the encapsulant 130. The opened portions of the redistribution layer 112b may be utilized as marking patterns. Alternatively, separate connection terminals, or the like, may be connected to the opened portions of the redistribution layer 112b to thus be applied to a package-on-package structure, and a surface mount technology (SMT) component may be disposed on the opened portions of the redistribution layer 112b.

The materials of the encapsulant 130 are not particularly limited, but may be, for example, an insulating material. In more detail, a material of the encapsulant 130 may be for example, ABF, or the like, that includes an inorganic filler and an insulating resin, but does not include a glass cloth. In this case, a problem such as a void or delamination may be solved. Meanwhile, the inorganic filler may be a known inorganic filler, and the insulating resin may be a known epoxy resin, or the like. However, the inorganic filler and the insulating resin are not limited thereto.

The second interconnection member 140 may be configured to redistribute the connection pads 122 of the semiconductor chip 120 to a fan-in region or a fan-out region. Several ten to several hundred connection pads 122 having various functions may be redistributed by the second interconnection member 140, and may be physically or electrically connected to an external source through connection terminals 170 to be described below depending on the functions. The second interconnection member 140 may include insulating layers 141, the redistribution layers 142 disposed on the insulating layers 141, and vias 143 penetrating through the insulating layers 141 and connecting the redistribution layers 142 to each other.

An insulating material may be used as a material of the insulating layers 141. In this case, a photosensitive insulating material such as a photoimagable dielectric (PID) resin may also be used as the insulating material. In this case, the insulating layer 141 may be formed to have a smaller thickness, and a fine pitch of the vias 143 may be achieved more easily. When the insulating layers 141 are multiple layers, materials of the respective insulating layers 141 may be the same as each other, and may also be different from each other. When the insulating layers 141 are the multiple layers, the insulating layers 141 may be integrated with each other depending on a process, such that a boundary therebetween may not be readily apparent.

The redistribution layers 142 may serve to substantially redistribute the connection pads 122, and a material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions, depending on designs of layers corresponding thereto. For example, the redistribution layers 142 may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may serve as a via pad, a connection terminal pad, and the like. A surface treatment layer (not illustrated) may further be formed on portions of a redistribution layer 142 externally exposed from the redistribution layers 142, if necessary. The surface treatment layer (not illustrated) is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 143 may electrically connect the redistribution layers 142, the connection pads 122, or the like, formed on different layers to each other, resulting in an electrical pathway in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The each of vias 143 may be entirely filled with the conductive material, or the conductive material may also be formed along a wall of each of the vias. In addition, a vertical cross section of each of the vias 143 may have all shapes known in the related art, such as a tapered shape, a cylindrical shape, and the like.

A case in which the second interconnection member 140 has one insulating layer 141 and one redistribution layer 142 and vias 143 depending on one insulating layer 141 is illustrated in the drawings, but the second interconnection member 140 is not limited thereto. That is, the second interconnection member 140 may include a larger number of insulating layers depending on a design thereof, and thus include a larger number of distribution layers and vias. That is, the second interconnection member 140 may also be formed of a plurality of layers.

The passivation layer 150 may be introduced, if necessary, and may be configured to protect the second interconnection member 140 from external physical or chemical damage. The passivation layer 150 may have the openings 151 exposing portions of the redistribution layer 142 of the second interconnection member 140, that is, at least some of the connection terminal pads. The number of openings 151 formed in the passivation layer 150 may be several tens to several thousands.

A material of the passivation layer 150 is not particularly limited, but may be a photosensitive insulating material such as a PID resin. Alternatively, a solder resist may also be used as a material of the passivation layer 150. Alternatively, an insulating material that includes a filler and a resin, but does not include a glass cloth, for example, ABF, or the like, may be used as a material of the passivation layer 150. A surface roughness of the passivation layer 150 may be lower as compared to a general case. When the surface roughness is low as described above, several side effects that may ensue in a circuit forming process, for example, generation of a stain on a surface, difficulty in implementing a fine circuit, and the like, may be improved.

The under-bump metal layer 160 may be introduced, if necessary, and may improve connection reliability of connection terminals 170 to be described below to thus improve reliability of the fan-out semiconductor package. The under-bump metal layer 160 may be formed on the insulating layer 141 or the openings 151 of the passivation layer 150 to be connected to the opened portions of the redistribution layer 142. The under-bump metal layer 160 may include a seed layer and a conductor layer formed on the seed layer. The seed layer and the conductor layer may include a known conductive materials, preferably, electroless copper and electrolytic copper, respectively. The seed layer may have a thickness smaller than that of the conductor layer.

The connection terminals 170 may be configured to physically or electrically externally connect the fan-out semiconductor package 100A. For example, the fan-out semiconductor package 100A according to the exemplary embodiment may be directly mounted on a main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto. The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Although not illustrated, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be encapsulated together with the semiconductor chip in the through-hole 110H. In addition, a surface mount technology (SMT) component may be mounted on the passivation layer 150.

Figure 12:
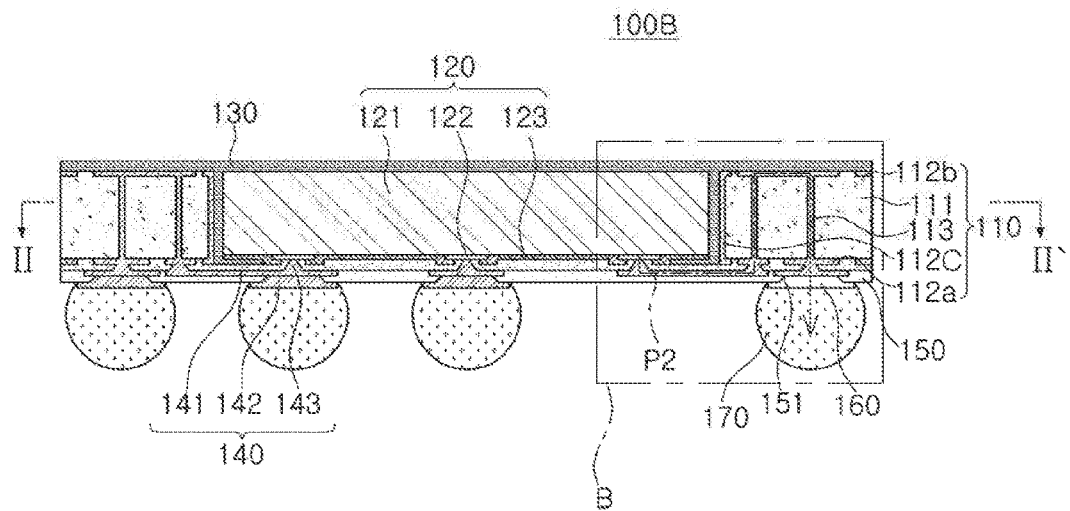
FIG. 12 is a schematic cross-sectional view illustrating another example of a fan-out semiconductor package.

FIG. 12 is a schematic cross-sectional view illustrating another example of a fan-out semiconductor package.

Figure 13:
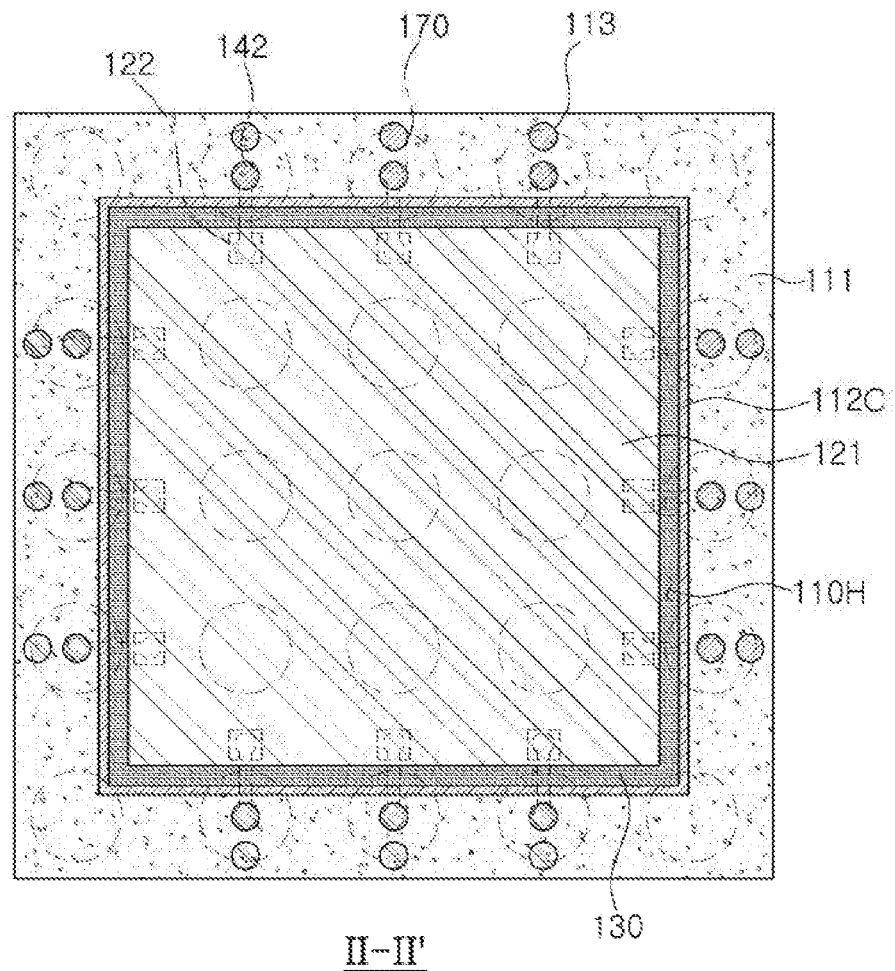
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Figure 14:
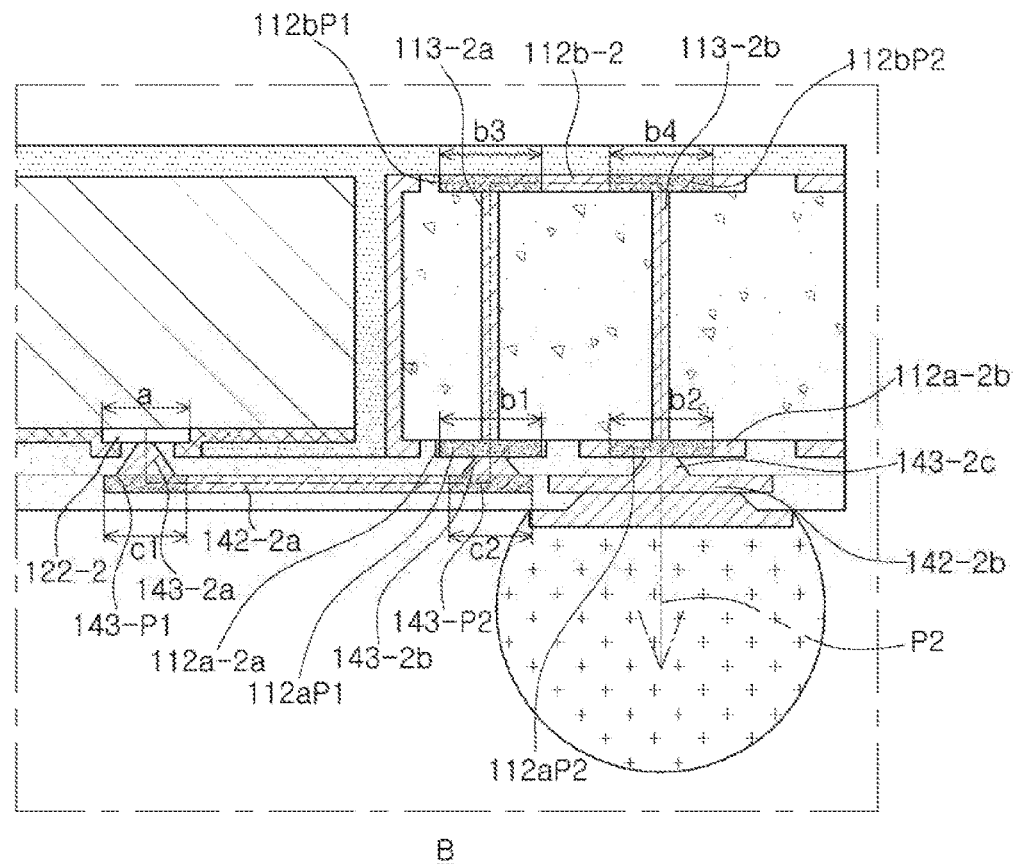
FIG. 14 is a schematic enlarged view illustrating region B of the fan-out semiconductor package of FIG. 12.

FIG. 14 is a schematic enlarged view illustrating region B of the fan-out semiconductor package of FIG. 12.

Referring to the drawings, a fan-out semiconductor package 100B according to another exemplary embodiment in the present disclosure may include a first interconnection member 110 having a through-hole 110H, a semiconductor chip 120 disposed in the through-hole 110H and having connection pads 122 disposed on one surface thereof, an encapsulant 130 encapsulating at least portions of the first interconnection member 110 and the semiconductor chip 120, a second interconnection member 140 disposed on the first interconnection member 110 and the semiconductor chip 120 and redistributing the connection pads 122 up to a fan-out region, a passivation layer 150 disposed on the second interconnection member 140 and having openings 151 exposing at least portions of connection terminal pads of the second interconnection member 140, an under-bump metal layer 160 disposed in the openings 151 of the passivation layer 150, and connection terminals 170 disposed on the under-bump metal layer 160.

In this case, at least one 122-2 of the connection pads 122 of the semiconductor chip 120, for example, a connection pad 122-2 disposed in an outer region of the fan-out semiconductor package on which stress is concentrated, may be electrically connected to at least one 170-2 of the connection terminals 170 through a pathway P2 passing through a via 143-2a of the second interconnection member 140, a redistribution layer 142-2a of the second interconnection member 140, a via 143-2b of the second interconnection member 140, a redistribution layer 112a-2a of the first interconnection member 110, a via 113-2a of the first interconnection member 110, a redistribution layer 112b-2 of the first interconnection member 110, a via 113-2b of the first interconnection member 110, a redistribution layer 112a-2b of the first interconnection member 110, a via 143-2c of the second interconnection member 140, and a redistribution layer 142-2b of the second interconnection member 140 in the abovementioned sequence or an opposite sequence to the abovementioned sequence.

In a case in which at least one 122-2 of the connection pads 122 of the semiconductor chip 120, for example, the connection pad 122-2 disposed in the outer region of the fan-out semiconductor package on which stress is concentrated, is electrically connected to at least one 170-2 of the connection terminals 170 through the pathway P2 passing through all of the redistribution layers 112a-2a and 112a-2b disposed on one side of the first interconnection member 110 and the redistribution layer 112b-2 disposed at the other side of the first interconnection member 110 as described above, a vertical cross-sectional shape of the pathway P2 may be, for example, a meandering shape and a direction of the pathway P2 may be alternately changed into one direction and the other direction, such that the stress transferred from the connection terminals after the fan-out semiconductor package 100B is mounted on a board may be offset in a process in which the stress passes through the pathway P2. Resultantly, board level reliability of the fan-out semiconductor package 100B may be improved.

Meanwhile, horizontal cross-sectional areas b1 and b2 of some via pads 112aP1 and 112aP2 of the redistribution layers 112a-2a and 112a-2b formed on one side of the first interconnection member 110 may be equal to or greater than a horizontal cross-sectional area a of the connection pad 122-2. For example, a ratio (b1 or b2/a) between the horizontal cross-sectional areas may be about 1 to 2. More preferably, the ratio (b1 or b2/a) may exceed 1 and may be 2 or less. In addition, the horizontal cross-sectional areas b1 and b2 of some via pads 112aP1 and 112aP2 of the redistribution layers 112a-2a and 112a-2b formed on one side of the first interconnection member 110 may be equal to or greater than horizontal cross-sectional areas c1 and c2 of some via pads 142P1 and 142P2 of the redistribution layer 142-2a of the second interconnection member 140. For example, a ratio (b1 or b2/c1 or c2) between the horizontal cross-sectional areas may be about 1 to 2. More preferably, the ratio (b1 or b2/c1 or c2) may exceed and may be 2 or less. In addition, the horizontal cross-sectional area a of the connection pad 122-2 may be equal to or greater than the horizontal cross-sectional areas c1 and c2 of some via pads 142P1 and 142P2 of the redistribution layer 142-2a of the second interconnection member 140. For example, a ratio (a/c1 or c2) between the horizontal cross-sectional areas may be about 1 to 2. More preferably, the ratio (a/c1 or c2) may exceed 1 and may be 2 or less. In this case, matching properties of the vias 143-2a and 143-2b of the second interconnection member 140 in a process may be improved.

In detail, the fan-out semiconductor package 100B according to another exemplary embodiment may also be manufactured by forming the first interconnection member 110, disposing the semiconductor chip 120 in the first interconnection member 110, encapsulating the first interconnection member 110 and the semiconductor chip 120 with the encapsulant 130, and forming the second interconnection member 140 on one surfaces of the first interconnection member 110 and the semiconductor chip 120. In this case, due to tolerance generated at the time of disposing the semiconductor chip 120, tolerance caused by contraction, or the like, of the encapsulant 130, and the like, connectivity between the vias 143-2a and 143-2b of the second interconnection member 140 and the connection pad 122-2 of the semiconductor chip 120 or the via pads 112aP1 and 112aP of the first interconnection member 110 at the time of connecting the vias 143-2a and 143-2b to the connection pad 122-2 or the via pads 112aP1 and 112aP2 may be reduced. The horizontal cross-sectional area a of the connection pad 122-2 of the semiconductor chip 120 or the horizontal cross-sectional areas b1 and b2 of the via pads 112aP1 and 112aP2 of the first interconnection member 110 need to be widened in order to significantly reduce the tolerances. However, there is a limitation in increasing a two-dimensional area of the connection pad 122-2 of the semiconductor chip 120. Therefore, the tolerances generated due to various causes may be significantly reduced by allowing the via pads 112aP1 and 112aP2 of the first interconnection member 110 to have the relatively largest horizontal cross-sectional areas b1 and b2.

Similarly, in the fan-out semiconductor package 100B according to another exemplary embodiment, an exposed horizontal cross-sectional area (not denoted by a reference numeral) of the connection pad 122-2 may be equal to or greater than a connection area (not denoted by a reference numeral) of the via 143-2a of the second interconnection member 140 in contact with the connection pad 122-2. In addition, the horizontal cross-sectional areas b1 and b2 of some via pads 112aP1 and 112aP2 of the redistribution layer 112a-2 formed on one side of the first interconnection member 110 may be equal to or greater than a connection area (not denoted by a reference numeral) of the via 143-2b of the second interconnection member 140 connected to the via pads 112aP1 and 112aP2. In this case, similarly, matching properties of the vias 143-2a and 143-2b of the second interconnection member 140 in a process may be improved.

Meanwhile, the horizontal cross-sectional areas bland b2 of some via pads 112aP1 and 112aP2 of the redistribution layer 112a-2 formed on one side of the first interconnection member 110 may be equal to or greater than horizontal cross-sectional areas b3 and b4 of some via pads 112bP1 and 112bP2 of the redistribution layer 112b-2 formed at the other side of the first interconnection member 110. Since some via pads 112aP1 and 112aP2 of the redistribution layer 112a-2 formed particularly on one side of the first interconnection member 110 are associated with the tolerances, the via pads 112aP1 and 112aP2 may be formed so that the horizontal cross-sectional area b1 and b2 are relatively greater than the horizontal cross-sectional areas b3 and b4.

Meanwhile, vias 113 may electrically connect redistribution layers 112a and 112b formed on different layers to each other, resulting in an electrical pathway in the first interconnection member 110. A material of each of the vias 113 may be a conductive material such as copper (Cu), aluminum (Al), silver (Ag), tin (Sn), gold (Au), nickel (Ni), lead (Pb), titanium (Ti), or alloys thereof. Each of the vias 113 may be entirely filled with the conductive material, or the conductive material may be formed along a wall of respective via holes unlike illustrated in the drawings. In addition, a vertical cross section of each of the vias 113 may have all shapes known in the related art, such as a tapered shape, a sandglass shape, and the like, as well as a cylindrical shape. Meanwhile, although not illustrated, when insulating layers are a plurality of layers, a redistribution layer may further be formed between the insulating layers. In this case, vias may also be a plurality of layers.

A description, or the like, of configurations other than the abovementioned configuration overlaps that described above, and is thus omitted.

Figure 15:
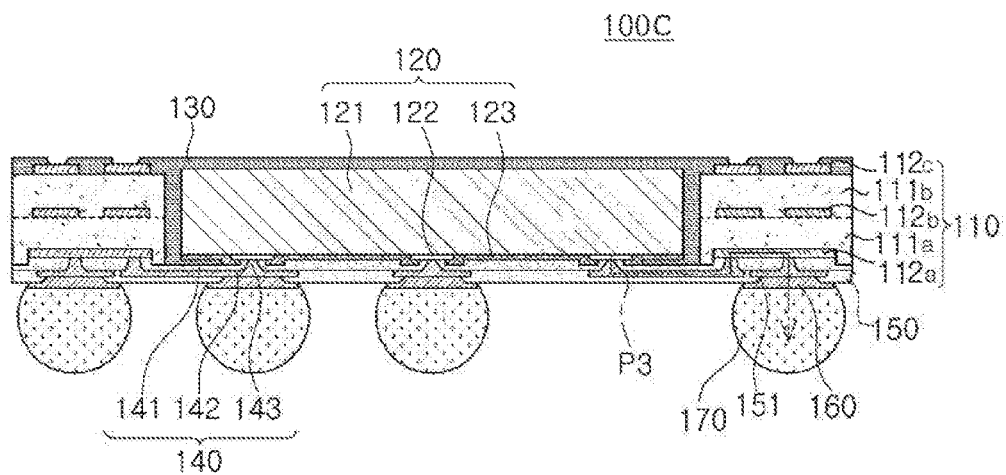
FIG. 15 is a schematic cross-sectional view illustrating another example of a fan-out semiconductor package.

FIG. 15 is a schematic cross-sectional view illustrating another example of a fan-out semiconductor package.

Referring to the drawing, a fan-out semiconductor package 100C according to another exemplary embodiment in the present disclosure may include a first interconnection member 110 having a through-hole 110H, a semiconductor chip 120 disposed in the through-hole 110H and having connection pads 122 disposed on one surface thereof, an encapsulant 130 encapsulating at least portions of the first interconnection member 110 and the semiconductor chip 120, a second interconnection member 140 disposed on the first interconnection member 110 and the semiconductor chip 120 and redistributing the connection pads 122 up to a fan-out region, a passivation layer 150 disposed on the second interconnection member 140 and having openings 151 exposing at least portions of connection terminal pads of the second interconnection member 140, an under-bump metal layer 160 disposed in the openings 151 of the passivation layer 150, and connection terminals 170 disposed on the under-bump metal layer 160.

The first interconnection member 110 may include a first insulating layer 111a in contact with the second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. In the fan-out semiconductor package 100C according to another exemplary embodiment, the first interconnection member 110 may include a large number of redistribution layers 112a, 112b, and 112c to thus further simplify the second interconnection member 140. Therefore, a decrease in a yield depending on a defect occurring in a process of forming the second interconnection member 140 may be improved. Meanwhile, although not illustrated in the drawing, the first to third redistribution layers 112a, 112b, and 112c may be electrically connected to each other by vias (not illustrated) penetrating through the first and second insulating layers 111a and 111b.

A lower surface of the first redistribution layer 112a of the first interconnection member 110 may be disposed on a level above a lower surface of the connection pad 122 of the semiconductor chip 120. A distance between a redistribution layer 142 of the second interconnection member 140 and the first redistribution layer 112a of the first interconnection member 110 may be greater than that between the redistribution layer 142 of the second interconnection member 140 and the connection pad 122 of the semiconductor chip 120. Here, the first redistribution layer 112a may be recessed into the first insulating layer 111a. The second redistribution layer 112b of the first interconnection member 110 may be disposed on a level between an active surface and an inactive surface of the semiconductor chip 120. The first interconnection member 110 may be formed at have a thickness corresponding to that of the semiconductor chip 120. Therefore, the second redistribution layer 112b formed in the first interconnection member 110 may be disposed on a level between the active surface and the inactive surface of the semiconductor chip 120. Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, and 112c may be formed to be large depending on a scale of the first interconnection member 110. On the other hand, the redistribution layers 142a and 142b of the second interconnection member 140 may be formed to be relatively small for thinness.

At least one of the connection pads 122 of the semiconductor chip 120, for example, a connection pad disposed in an outer region of the fan-out semiconductor package on which stress is concentrated, may be electrically connected to at least one of the connection terminals 170 through a pathway P3 passing through a via 143 of the second interconnection member 140, a redistribution layer 142 of the second interconnection member 140, a via 143 of the second interconnection member 140, a first redistribution layer 112a of the first interconnection member 110, a via 143 of the second interconnection member 140, and a redistribution layer 142 of the second interconnection member 140 in the abovementioned sequence or an opposite sequence to the abovementioned sequence. Although not illustrated in the drawing, the electrical pathway P3 does not pass through a first redistribution layer 112a of the first interconnection member 110, but may also pass through a first redistribution layer 112a of the first interconnection member 110, a first via (not illustrated) of the first interconnection member 110, a second redistribution layer 112b of the first interconnection member 110, a first via (not illustrated) of the first interconnection member 110, and a first redistribution layer 112a of the first interconnection member 110 in the abovementioned sequence or an opposite sequence to the abovementioned sequence. Alternatively, although not illustrated in the drawing, the electrical pathway P3 does not pass through a first redistribution layer 112a of the first interconnection member 110, but may also pass through a first redistribution layer 112a of the first interconnection member 110, a first via (not illustrated) of the first interconnection member 110, a second redistribution layer 112b of the first interconnection member 110, a second via (not illustrated) of the first interconnection member 110, a third redistribution layer 112c of the first interconnection member 110, a second via (not illustrated) of the first interconnection member 110, a second redistribution layer 112b of the first interconnection member 110, a first via (not illustrated) of the first interconnection member 110, and a first redistribution layer 112a of the first interconnection member 110 in the abovementioned sequence or an opposite sequence to the abovementioned sequence. In this case, similarly, board level reliability of the fan-out semiconductor package may be improved.

A description, or the like, of configurations other than the abovementioned configuration overlaps that described above, and is thus omitted.

Figures 16, 17:
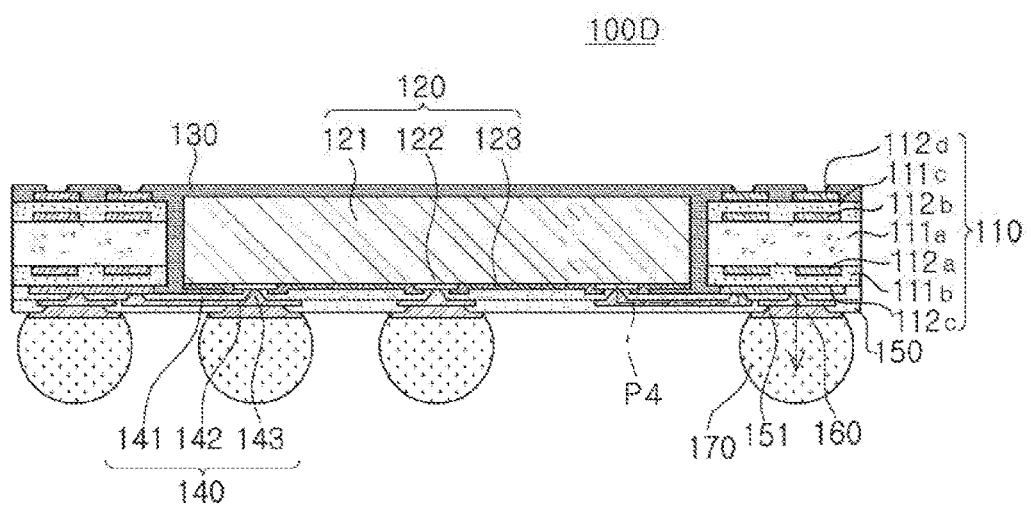
FIG. 16 is a schematic cross-sectional view illustrating another example of a fan-out semiconductor package.
FIGS. 17 and 18 are, respectively, a table and graphs, schematically illustrating thermal impact reliability results depending on electrical pathways between connection pads of a semiconductor chip and connection terminals.

FIG. 16 is a schematic cross-sectional view illustrating another example of a fan-out semiconductor package.

Referring to the drawing, a fan-out semiconductor package 100D according to another exemplary embodiment in the present disclosure may include a first interconnection member 110 having a through-hole 110H, a semiconductor chip 120 disposed in the through-hole 110H and having connection pads 122 disposed on one surface thereof, an encapsulant 130 encapsulating at least portions of the first interconnection member 110 and the semiconductor chip 120, a second interconnection member 140 disposed on the first interconnection member 110 and the semiconductor chip 120 and redistributing the connection pads 122 up to a fan-out region, a passivation layer 150 disposed on the second interconnection member 140 and having openings 151 exposing at least portions of connection terminal pads of the second interconnection member 140, an under-bump metal layer 160 disposed in the openings 151 of the passivation layer 150, and connection terminals 170 disposed on the under-bump metal layer 160.

The first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. In the fan-out semiconductor package 100D according to another exemplary embodiment, the first interconnection member 110 may include a large number of redistribution layers 112a, 112b, 112c, and 112d to thus further simplify the second interconnection member 140. Therefore, a decrease in a yield depending on a defect occurring in a process of forming the second interconnection member 140 may be improved. Meanwhile, although not illustrated in the drawing, the first to fourth redistribution layers 112a, 112b, 112c, and 112d may be electrically connected to each other by vias (not illustrated) penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be formed of, for example, prepreg including a glass cloth, an inorganic filler, and an insulating resin, and the second insulating layer 111b and the third insulating layer 111c may be formed of an ABF or a photosensitive insulating film including an inorganic filler and an insulating resin. However, the materials of the first insulating layer 111a and the second and third insulating layers 111b and 111c are not limited thereto. A lower surface of the third redistribution layer 112c of the first interconnection member 110 may be disposed on a level below a lower surface of the connection pad 122 of a semiconductor chip 120. A distance between a redistribution layer 142 of the second interconnection member 140 and the third redistribution layer 112c of the first interconnection member 110 may be smaller than that between the redistribution layer 142 of the second interconnection member 140 and the connection pad 122 of the semiconductor chip 120. Here, the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed at have a thickness corresponding to that of the semiconductor chip 120. Therefore, the first redistribution layer 112a and the second redistribution layer 112b formed in the first interconnection member 110 may be disposed on a level between an active surface and an inactive surface of the semiconductor chip 120. Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layers 142a and 142b of the second interconnection member 140 may be formed to be relatively small for thinness.

At least one of the connection pads 122 of the semiconductor chip 120, for example, a connection pad disposed in an outer region of the fan-out semiconductor package on which stress is concentrated, may be electrically connected to at least one of the connection terminals 170 through a pathway P4 passing through a via 143 of the second interconnection member 140, a redistribution layer 142 of the second interconnection member 140, a via 143 of the second interconnection member 140, a third redistribution layer 112c of the first interconnection member 110, a via 143 of the second interconnection member 140, and a redistribution layer 142 of the second interconnection member 140 in the abovementioned sequence or an opposite sequence to the abovementioned sequence. Although not illustrated in the drawing, the pathway P4 does not pass through a third redistribution layer 112c of the first interconnection member 110, but may also pass through a third redistribution layer 112c of the first interconnection member 110, a second via (not illustrated) of the first interconnection member 110, a first redistribution layer 112a of the first interconnection member 110, a second via (not illustrated) of the first interconnection member 110, and a third redistribution layer 112c of the first interconnection member 110 in the abovementioned sequence or an opposite sequence to the abovementioned sequence. Alternatively, although not illustrated in the drawing, the electrical pathway P4 does not pass through a third redistribution layer 112c of the first interconnection member 110, but may also pass through a third redistribution layer 112c of the first interconnection member 110, a second via (not illustrated) of the first interconnection member 110, a first redistribution layer 112a of the first interconnection member 110, a first via (not illustrated) of the first interconnection member 110, a second redistribution layer 112b of the first interconnection member 110, a first via (not illustrated) of the first interconnection member 110, a first redistribution layer 112a of the first interconnection member 110, a second via (not illustrated) of the first interconnection member 110, and a third redistribution layer 112c of the first interconnection member 110 in the abovementioned sequence or an opposite sequence to the abovementioned sequence. Alternatively, although not illustrated in the drawing, the electrical pathway P4 does not pass through a third redistribution layer 112c of the first interconnection member 110, but may also pass through a third redistribution layer 112c of the first interconnection member 110, a second via (not illustrated) of the first interconnection member 110, a first redistribution layer 112a of the first interconnection member 110, a first via (not illustrated) of the first interconnection member 110, a second redistribution layer 112b of the first interconnection member 110, a third via (not illustrated) of the first interconnection member 110, a fourth redistribution layer 112d of the first interconnection member 110, a third via (not illustrated) of the first interconnection member 110, a second redistribution layer 112b of the first interconnection member 110, a first via (not illustrated) of the first interconnection member 110, a first redistribution layer 112a of the first interconnection member 110, a second via (not illustrated) of the first interconnection member 110, and a third redistribution layer 112c of the first interconnection member 110 in the abovementioned sequence or an opposite sequence to the abovementioned sequence. In this case, similarly, board level reliability of the fan-out semiconductor package may be improved.

A description, or the like, of configurations other than the abovementioned configuration overlaps that described above, and is thus omitted.

Figure 18:
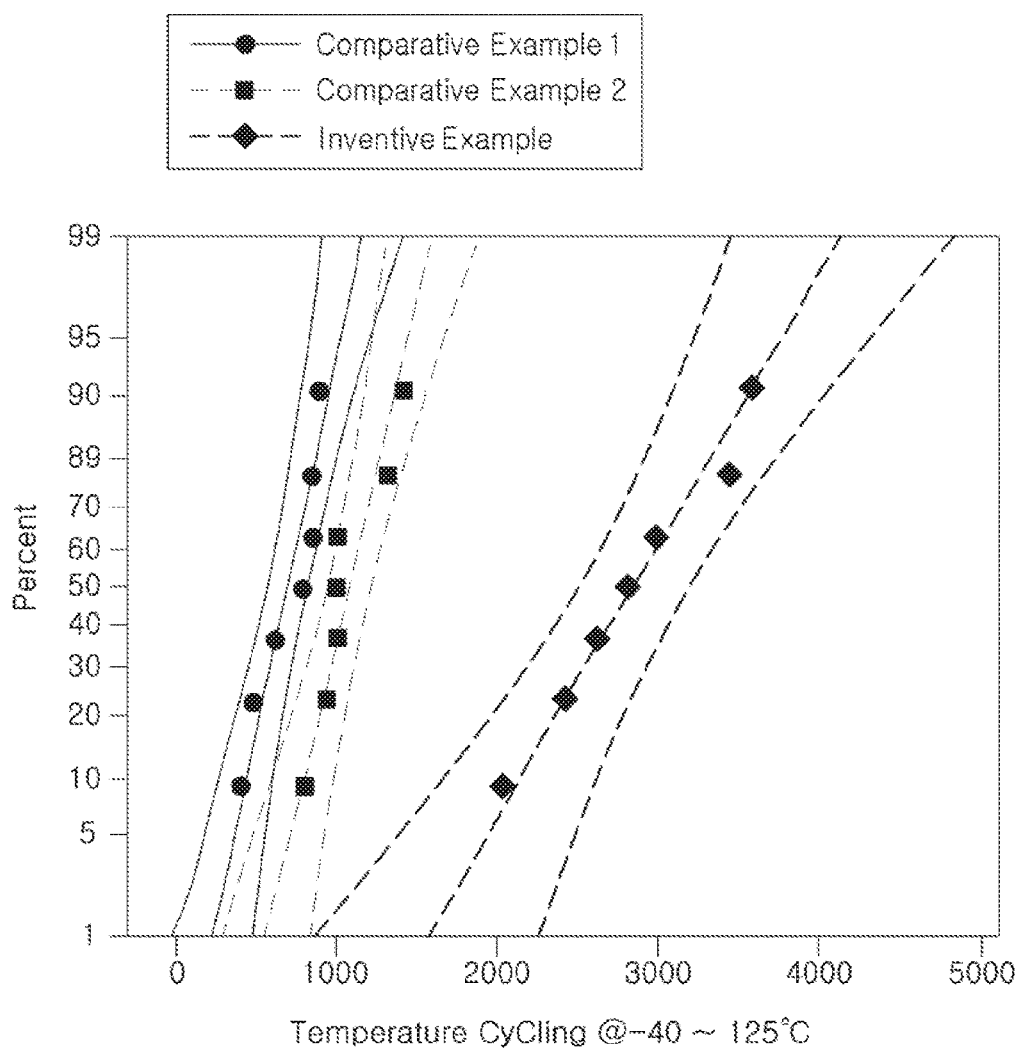

FIGS. 17 and 18 are, respectively, a table and graphs, schematically illustrating thermal impact reliability results depending on electrical pathways between connection pads of a semiconductor chip and connection terminals.

Referring to the drawings, it may be appreciated that thermal impact reliability results of Inventive Example and Comparative Examples 1 and 2 are very different from each other and, particularly, the number of times of an initial defect occurrence cycle in Inventive Example is 2,013, which is about five times more excellent than 442 corresponding to the number of times of an initial defect occurrence cycle in Comparative Example 1. In addition, it may be appreciated that Inventive Example is two times or more robust to thermal impact as compared to Comparative Example 2. Meanwhile, in the drawings, Inventive Example refers to a case in which a connection pad disposed in a region of the fan-out semiconductor package on which stress is concentrated and a connection terminal are electrically connected to each other by a pathway passing through a redistribution layer of a first interconnection member as in the fan-out semiconductor package 100A according to the exemplary embodiment, Comparative Example 1 refers to a case in which a connection pad and a connection terminal are electrically connected to each other by a stacked via, and Comparative Example 2 refers to a case in which a connection pad and a connection terminal are electrically connected to each other by a staggered via. In this case, all of design and manufacturing specifications such as sizes (40 μm) of vias of redistribution layers, thicknesses of insulating layers of the redistribution layers, and sizes and pitches of solder balls used as connection terminals, and the like, in Inventive Example and Comparative Examples are the same as each other. In this condition, a daisy chain was configured, and a thermal impact test was performed to figure out a via open tendency due to thermal impact.

As set forth above, according to the exemplary embodiment in the present disclosure, a fan-out semiconductor package of which performance is excellent and board level reliability may be improved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a semiconductor chip disposed in the through-hole of the first interconnection member and having an active surface having connection pads disposed thereon and an inactive surface opposing the active surface;
an encapsulant encapsulating at least portions of the first interconnection member and the semiconductor chip;
a second interconnection member disposed on the first interconnection member and the semiconductor chip; and
connection terminals disposed on the second interconnection member,
wherein the first interconnection member and the second interconnection member each include a redistribution layer electrically connected to the connection pads of the semiconductor chip, and
the connection pads and the connection terminals are electrically connected to each other by an electrical pathway traversing the redistribution layer of the first interconnection member.

2. The fan-out semiconductor package of claim 1, wherein the electrical pathway traverses the connection terminal, the redistribution layer of the second interconnection member, the redistribution layer of the first interconnection member, the redistribution layer of the second interconnection member, and the connection terminal in sequence.

3. The fan-out semiconductor package of claim 1, wherein the first interconnection member has a first side and a second side opposing the first side, each of the first and the second sides having a redistribution layer, and
the electrical pathway traverses the redistribution layer disposed on the first side of the first interconnection member, a first via penetrating through the first interconnection member, the redistribution layer disposed on the second side of the first interconnection member, a second via penetrating through the first interconnection member, and the redistribution layer disposed on the first side of the first interconnection member in sequence.

4. The fan-out semiconductor package of claim 1, wherein the redistribution layer of the first interconnection member includes a via pad, and
   a horizontal cross-sectional area of the via pad of the redistribution layer of the first interconnection member is equal to or greater than that of the connection pad of the semiconductor chip.

5. The fan-out semiconductor package of claim 1, wherein the redistribution layers of the first interconnection member and the second interconnection member respectively include via pads, and
   a horizontal cross-sectional area of the via pad of the redistribution layer of the first interconnection member is equal to or greater than that of the via pad of the redistribution layer of the second interconnection member.

6. The fan-out semiconductor package of claim 1, wherein the redistribution layer of the second interconnection member includes a via pad, and
   a horizontal cross-sectional area of the connection pad of the semiconductor chip is equal to or greater than that of the via pad of the redistribution layer of the second interconnection member.

7. The fan-out semiconductor package of claim 1, wherein the first interconnection member includes a first insulating layer, a first redistribution layer in contact with the second interconnection member and embedded in a first surface of the first insulating layer, and a second redistribution layer disposed on a second surface of the first insulating layer opposing the first surface of the first insulating layer.

8. The fan-out semiconductor package of claim 7, wherein the first interconnection member further includes a second insulating layer disposed on the first insulating layer and covering the second redistribution layer and a third redistribution layer disposed on the second insulating layer.

9. The fan-out semiconductor package of claim 7, wherein a distance between the redistribution layer of the second interconnection member and the first redistribution layer is greater than that between the redistribution layer of the second interconnection member and the connection pad.

10. The fan-out semiconductor package of claim 7, wherein the first redistribution layer has a thickness greater than that of the redistribution layer of the second interconnection member.

11. The fan-out semiconductor package of claim 7, wherein a lower surface of the first redistribution layer is disposed on a level above a lower surface of the connection pad.

12. The fan-out semiconductor package of claim 8, wherein the second redistribution layer is disposed on a level between the active surface and the inactive surface of the semiconductor chip.

13. The fan-out semiconductor package of claim 1, wherein the first interconnection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

14. The fan-out semiconductor package of claim 13, wherein the first interconnection member further includes a third insulating layer disposed on the first insulating layer and covering the second redistribution layer and a fourth redistribution layer disposed on the third insulating layer.

15. The fan-out semiconductor package of claim 13, wherein the first insulating layer has a thickness greater than that of the second insulating layer.

16. The fan-out semiconductor package of claim 13, wherein the third redistribution layer has a thickness greater than that of the redistribution layer of the second interconnection member.

17. The fan-out semiconductor package of claim 13, wherein the first redistribution layer is disposed on a level between the active surface and the inactive surface of the semiconductor chip.

18. The fan-out semiconductor package of claim 13, wherein a lower surface of the third redistribution layer is disposed on a level below a lower surface of the connection pad.

19. The fan-out semiconductor package of claim 4, wherein a ratio of the horizontal cross-sectional area of the via pad of the redistribution layer of the first interconnection member to that of the connection pad of the semiconductor chip is greater than 1 and less than or equal to 2.

20. The fan-out semiconductor package of claim 5, wherein a ratio of the horizontal cross-sectional area of the via pad of the redistribution layer of the first interconnection member to that of the redistribution layer of the second interconnection member is greater than 1 and less than or equal to 2.

21. The fan-out semiconductor package of claim 3, wherein the redistribution layers disposed on the first and second sides of the first interconnection member each include a via pad, and
   a horizontal cross-sectional area of the via pad of the redistribution layer disposed on the first side of the first interconnection member is equal to or greater than that of the redistribution layer disposed on the second side of the first interconnection member.

* * * * *